(12) United States Patent
Yoshii et al.

(10) Patent No.: US 9,400,422 B2
(45) Date of Patent: Jul. 26, 2016

(54) METHOD FOR MANUFACTURING PHOTOMASK BLANK

(71) Applicant: SHIN-ETSU CHEMICAL CO., LTD., Tokyo (JP)

(72) Inventors: Takashi Yoshii, Jyoetsu (JP); Yoshio Kawai, Jyoetsu (JP); Yukio Inazuki, Jyoetsu (JP); Satoshi Watanabe, Jyoetsu (JP); Akira Ikeda, Jyoetsu (JP); Toyohisa Sakurada, Jyoetsu (JP); Hideo Kaneko, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 167 days.

(21) Appl. No.: 14/489,229

(22) Filed: Sep. 17, 2014

(65) Prior Publication Data

US 2015/0086909 A1    Mar. 26, 2015

(30) Foreign Application Priority Data

Sep. 25, 2013  (JP) .................................. 2013-198550
Aug. 5, 2014   (JP) .................................. 2014-159648
Aug. 13, 2014  (JP) .................................. 2014-164976

(51) Int. Cl.
*G03F 1/26* (2012.01)
*G03F 1/32* (2012.01)
*G03F 1/50* (2012.01)
*G03F 1/00* (2012.01)

(52) U.S. Cl.
CPC ................ *G03F 1/26* (2013.01); *G03F 1/0046* (2013.01); *G03F 1/0076* (2013.01); *G03F 1/32* (2013.01); *G03F 1/50* (2013.01)

(58) Field of Classification Search
CPC ............... G03F 1/26; G03F 1/32; G03F 1/50; G03F 1/0046; G03F 1/0076
USPC ............................................................. 430/5
See application file for complete search history.

(56) References Cited

U.S. PATENT DOCUMENTS

| 2007/0190459 A1 | 8/2007 | Hashimoto et al. |
| 2010/0081066 A1 | 4/2010 | Nozawa |
| 2012/0045713 A1 | 2/2012 | Hashimoto et al. |
| 2012/0100466 A1 | 4/2012 | Hashimoto et al. |

FOREIGN PATENT DOCUMENTS

| EP | 1 650 600 A2 | 4/2006 |
| EP | 2 233 975 A2 | 9/2010 |
| JP | A-63-85553 | 4/1988 |
| JP | A-7-49558 | 2/1995 |

OTHER PUBLICATIONS

May 4, 2015 Search Report issued in EP Application No. 14003228.5.

*Primary Examiner* — Christopher Young
(74) *Attorney, Agent, or Firm* — Oliff PLC

(57) ABSTRACT

The present invention relates to a photomask blank obtained by forming a resist film after performing a silylation process on a silicon-containing inorganic film and provides a method for manufacturing a photomask blank having at least a silicon-containing inorganic film over a transparent substrate and a resist film on the inorganic film, comprising: forming the silicon-containing inorganic film; heat treating the formed silicon-containing inorganic film at a temperature more than 200° C. under an atmosphere containing oxygen; performing a silylation process after the heat treatment; and then forming the resist film by application. The method can inhibit generation of defects due to resist residues or the like after development.

22 Claims, 2 Drawing Sheets

500
METHOD FOR MANUFACTURING PHOTOMASK BLANK

BACKGROUND OF THE INVENTION

1. Field of the Invention

The present invention relates to a method for manufacturing a photomask blank for a photomask for use in fabrication of a semiconductor integrated circuit and the like.

2. Description of the Related Art

In recent semiconductor processes, particularly the increasing scale of integration of large-scale integrated circuits increasingly requires the shrinking of circuit patterns. There is a growing demand for shrinking techniques of wiring patterns formed in circuits or contact hole patterns for wiring between layers formed in cells. In production of photomasks, in which circuit patterns are formed, for use in optical photolithography for forming these wiring patterns or contact hole patterns, there is accordingly a need for a technique to precisely form finer circuit patterns due to the above shrinking of the patterns.

Forming a resist pattern with high precision on a photomask blank is first needed to form a photomask pattern with higher precision on a photomask substrate. When an actual semiconductor substrate is processed, since optical photolithography employs reduced-size projection, the photomask pattern needs a size that is about four times greater than an actually needed pattern size. This however does not mean that the required precision is accordingly lowered, but a higher precision than that of the pattern after exposure is rather needed for a photomask serving as an original.

In addition, photolithography currently employed draws a circuit pattern with a significantly lower size compared with a wavelength of light to be used. Accordingly, if a photomask pattern having a size four times greater than that of a circuit form is used, then the photomask pattern form is not accurately transferred to a resist film due to influence of light interference occurring when the optical photolithography is performed, etc. For the purpose of reducing the influence, the photomask pattern sometimes needs to be formed into a more complex form (a form to which optical proximity correction (the so-called OPC) is applied) than an actual circuit pattern. There is accordingly a need for a higher-precision processing method in the photolithography technique to obtain photomask patterns. The performance of lithography may be represented by a resolution limit. The lithography technique in photomask forming processes requires a resolution limit substantially identical to or more than the resolution limit needed in optical photolithography employed in semiconductor processes using photomasks.

The procedure for forming a photomask pattern typically involves forming a photoresist film on a photomask blank having a light-shielding film on a transparent substrate, drawing a pattern by an electron beam, obtaining a resist pattern through development, and then etching the light-shielding film to form a light-shielding pattern while using the obtained resist pattern as an etching mask. If it attempts to achieve the shrinking of the light-shielding pattern while the same thickness of the resist film as that before the shrinking is maintained, then a ratio of a film thickness to the pattern, i.e., the an aspect ratio, becomes larger and pattern transfer thereby fails due to deterioration of the pattern form of the resist, or the resist pattern is broken or separated in some cases. The shrinking accordingly necessitates thinning a resist film thickness.

Use of hard masks has been tried before to reduce a burden on resists during dry etching. For example, Patent Document 1 reports that an $SiO_2$ film formed on $MoSi_2$ is used as an etching mask when $MoSi_2$ is dry etched with a gas containing chlorine, and the $SiO_2$ film can also function as an antireflection coating. In addition, there is disclosed that chromium is used for a light-shielding film on a phase shift film and an $SiO_2$ film on the light-shielding film is used as a hard mask in, for example, Patent Document 2.

PRIOR ART REFERENCES

Patent Literature

Patent Document 1: Japanese Unexamined Patent publication (Kokai) No. S63-85553
Patent Document 2: Japanese Unexamined Patent publication (Kokai) No. H7-49558

SUMMARY OF THE INVENTION

Technical Problem

The above-described shrinking of patterns makes adhesion of resists important. If a fine pattern with a size of, e.g., 50 nm or less is formed in a film containing Si on its surface above a photomask, then the resist pattern is separated due to poor adhesion to the film containing Si during development. It has been known that performing a silylation process using, e.g., hexamethyldisilazane is effective in avoiding the separation.

There however arises a problem in that the silylation process gives hydrophobicity to a surface and thereby makes cleaning of the surface difficult; thereby many resist residues remain in a cleaning process after development, resulting in defects. It is only necessary for improvement in cleaning ability to improve wettability by using isopropyl alcohol or the like. These solvents however adversely affect resist patterns.

The present invention was accomplished in view of the above-described problems and relates to a method for manufacturing a photomask blank, including forming a resist film after performing a silylation process on a silicon-containing inorganic film. It is an object of the present invention to provide a method for manufacturing a photomask blank that can inhibit generation of defects due to resist residues or the like after development.

Solution to Problem

To achieve this object, the present invention provides a method for manufacturing a photomask blank having at least a silicon-containing inorganic film over a transparent substrate and a resist film on the inorganic film, comprising: forming the silicon-containing inorganic film; heat treating the formed silicon-containing inorganic film at a temperature more than 200° C. under an atmosphere containing oxygen; performing a silylation process after the heat treatment; and then forming the resist film by application.

In such a manner, the adhesion between the silicon-containing inorganic film and the resist film can be improved by the silylation process, and even when a fine pattern is formed in the resist film, falling and separation of the resist pattern can be inhibited.

In addition, since the resist film is formed after the silylation process following the heat treatment performed on the formed silicon-containing inorganic film, generation of resist residues after development, which are conventionally generated in the case of performing a silylation process, can be inhibited, and the number of defects can thereby be reduced.

The method moreover is simple and easy because the above heat treatment is merely performed before the silylation process.

In the method, the heat treatment may be performed at a temperature more than 400° C.

In such a manner, the generation of resist residues after development can be further inhibited.

In the method, the silicon-containing inorganic film may further contain oxygen.

Forming the silicon-containing inorganic film further containing oxygen as above is more preferable.

Moreover, the silicon-containing inorganic film may be composed of silicon and oxygen.

In this manner, the silicon-containing inorganic film is more preferably formed from silicon and oxygen.

Moreover, a chromium-containing inorganic film may be formed before forming the silicon-containing inorganic film.

In photomask blanks, for example, a material containing chromium is often used for light-shielding films. Forming a chromium-containing inorganic film enables the chromium-containing inorganic film to be used as the light-shielding film or the like.

Moreover, a silicon-containing phase shift film may be formed on the transparent substrate before forming the chromium-containing inorganic film.

In such a manner, a photomask blank including a phase shift film can be manufactured and a photomask enabling a finer pattern to be formed with a higher resolution can be obtained.

Moreover, the silicon-containing inorganic film may be a hard mask.

In such a manner, the resist film can be thinned compared with the case without the hard mask, and a finer pattern (a pattern of 50 nm or less, for example) is readily formed.

Hexamethyldisilazane can be used for the silylation process.

Use of Hexamethyldisilazane (also referred to as HMDS, hereinafter) is preferred because it is commonly used in processes of semiconductor fabrication, such as photomask blanks.

Advantageous Effects of Invention

As described above, the inventive method for manufacturing a photomask blank enables the falling and separation of a resist pattern after exposure and development to be inhibited. The method also enables the generation of resist residues to be inhibited, thereby reducing the number of defects.

DESCRIPTION OF EMBODIMENTS

An embodiment of the present invention will now be specifically described with reference to figures, but the present invention is not limited to this embodiment.

The present inventors diligently studied photomask blanks. As described above, when a resist film is formed by application after a silicon-containing inorganic film is subjected to a silylation process, conventionally, many resist residues are generated after the resist film is exposed and developed. The present inventors, in contrast, found that performing a heat treatment (at a temperature more than 200° C. under an oxygen-containing atmosphere) after forming the silicon-containing inorganic film enables defects such as resist residues to be dramatically reduced even when a resist pattern is formed through the following silylation process, application of a resist, and development, thereby brought the present invention to completion.

Figure 1:
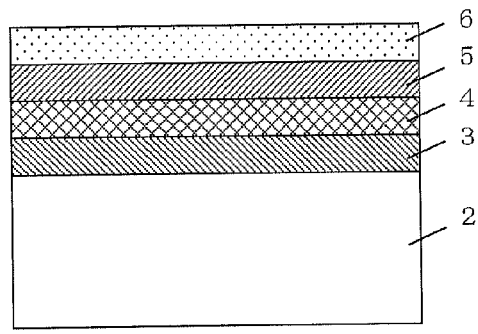
FIG. 1 is a schematic diagram of an exemplary photomask blank manufactured by the inventive method.

FIG. 1 shows an exemplary photomask blank manufactured by the inventive method. As shown in FIG. 1, in the photomask blank 1, for example, a silicon-containing phase shift film 3, a chromium-containing inorganic film (e.g., a light-shielding film 4), a silicon-containing inorganic film 5, and a resist film 6 is formed in this order on a transparent substrate 2.

The transparent substrate 2 for use in the photomask blank 1 may be composed of, but not limited to, a material that is transparent to an exposure light wavelength and has small amounts of thermal deformation at temperatures in manufacturing processes; a quartz substrate is given as an example of this material.

Next, the structure of films over the transparent substrate 2 will be described.

The silicon-containing inorganic film 5 may be an inorganic film containing, for example, silicon; or silicon and at least one selected from a group including oxygen, nitrogen, and carbon; or silicon and transition metal; or silicon, transition metal, and at least one selected from a group including oxygen, nitrogen, and carbon. Examples of such an inorganic film include an inorganic film composed of silicon; or oxygen and silicon; or nitrogen and silicon; or oxygen, nitrogen and silicon; or carbon and silicon; or carbon, oxygen and silicon; or carbon, nitrogen and silicon; or carbon, oxygen, nitrogen and silicon. Examples of an inorganic film containing transition metal include an inorganic film composed of transition metal and silicon; or transition metal, silicon and oxygen; or transition metal, nitrogen and silicon; or transition metal, oxygen, nitrogen and silicon; or transition metal, carbon, and silicon; or transition metal, carbon, oxygen, and silicon; or transition metal, carbon, nitrogen, and silicon; or transition metal, carbon, oxygen, nitrogen, and silicon.

An inorganic film composed of silicon, oxygen and nitrogen (an SiON film) and an inorganic film composed of silicon and oxygen (a SiO film) are particularly desirable.

Examples of the transition metal include molybdenum, tungsten, tantalum, titanium, zirconia, and hafnium. The silicon-containing inorganic film 5 is not limited to a kind of a contained transition metal and may contain two kinds or more of transition metals.

Hydrogen may also be contained.

The silicon-containing inorganic film 5 is subjected to the silylation process. The silicon-containing inorganic film 5, which is subjected to the silylation process, thereby has high adhesion to the resist film 6 formed thereon. The occurrence of falling and separation of a resist pattern can thereby be inhibited even when a fine pattern is formed in the resist film 6.

The silylation process performed on the silicon-containing inorganic film 5 may be for example, but not limited to, a process using HMDS, which is commonly used in semiconductor fabrication processes.

The silicon-containing inorganic film 5 is subjected to the silylation process after being subjected to a heat treatment at a temperature more than 200° C. under an oxygen-containing atmosphere.

In photomask blanks by a conventional method using a silylation process, many resist residues remain and cause defects after development. In contrast, the inventive method for manufacturing the photomask blank 1 can inhibit the generation of resist residues, which are generated in conventional photomask blanks, and reduce the number of defects.

The reason for the reduction in defects by the heat treatment is unclear; it can be understood that the reason is that the amount of OH or a bonding status of atoms in a contact plane between the silicon-containing inorganic film 5 and the resist film 6 changes.

It is only necessary for the structure of films to locate the silicon-containing inorganic film 5 directly under the resist film 6; the silicon-containing inorganic film 5 may function as, for example, an optical film such as a light-shielding film or a phase shift film, or a hard mask film for use in forming a pattern in the optical film, and also have an etching stopper film.

The present invention is particularly effective when a fine pattern, e.g., with a size of 50 nm or less, is formed. This effect is increased when the silicon-containing inorganic film 5 is used as a hard mask film.

When the silicon-containing inorganic film 5 is used as a hard mask film, the film thickness of the hard mask film is preferably 1 to 30 nm, further preferably 1 to 20 nm, more preferably 1 to 10 nm.

In the configuration in this embodiment, a light-shielding film 4 and a phase shift film 3 below the light-shielding film 4 are formed between the silicon-containing inorganic film 5 serving as the hard mask film and the transparent substrate 2. The silicon-containing inorganic film 5 serving as the hard mask film and the light-shielding film 4 preferably have etching selectiveness.

If the hard mask (etching mask) film (i.e., the silicon-containing inorganic film 5) is composed of a material that can be dry etched with a fluorine-based etching gas containing fluorine such as $CF_4$ or $SF_6$, then the etching process becomes easier; if the light-shielding film 4 and the other inorganic films formed below the above hard mask film are composed of a material that has resistance against the fluorine-based dry etching and can be etched by chlorine-based dry etching with an etching gas containing chlorine or chlorine and oxygen, then the etching process becomes easier. The light-shielding film 4 and the other inorganic films formed below the above hard mask film are desirably inorganic films containing chromium: for example, a film containing chromium, or chromium and at least one selected from a group including oxygen, nitrogen, and carbon. An antireflection layer may be formed on the hard mask film side of the light-shielding film 4, and a film containing a large amount of oxygen or nitrogen may be formed on its transparent substrate side to improve the adhesion and to be used as an antireflection film.

When the phase shift film 3 is formed between the light-shielding film 4 and the transparent substrate 2, the phase shift film 3 preferably has different etching properties from the light-shielding film 4. If the light-shielding film 4 has resistance against the fluorine-based dry etching and can be dry etched with an etching gas containing chlorine and oxygen as above, the phase shift film 3 need only be composed of a material that has resistance against dry etching with an etching gas containing chlorine and oxygen and can be etched by the fluorine-based etching; for example, a material containing silicon and at least one selected from a group including oxygen, nitrogen, and carbon may be used, or a transition metal may further be contained. Examples of the transition metal include molybdenum, tungsten, tantalum, titanium, zirconia, and hafnium. Hydrogen may be further contained.

If a light-shielding film is located below the resist film 6, then the material containing silicon may be the above-described material and the entire light-shielding film may serve as the silicon-containing inorganic film 5. If an antireflection layer is formed on the surface of a light-shielding film, then the antireflection layer (only) may serve as the silicon-containing inorganic film 5 and the light-shielding film may be formed of another material such as a chromium-containing film.

The material of the resist film 6 may be an electron beam resist for use in drawing with an electron beam or a photoresist for use in drawing with light. A chemically amplified resist is particularly effective. The chemically amplified resist may be either a positive type or a negative type, and composed of a resin based on hydroxystyrene or mainly an acid generating agent; a cross-linking agent may be added; at least one of quencher, surfactant and the like may be added; a (meth) acrylic acid resin may be used.

Figure 2:
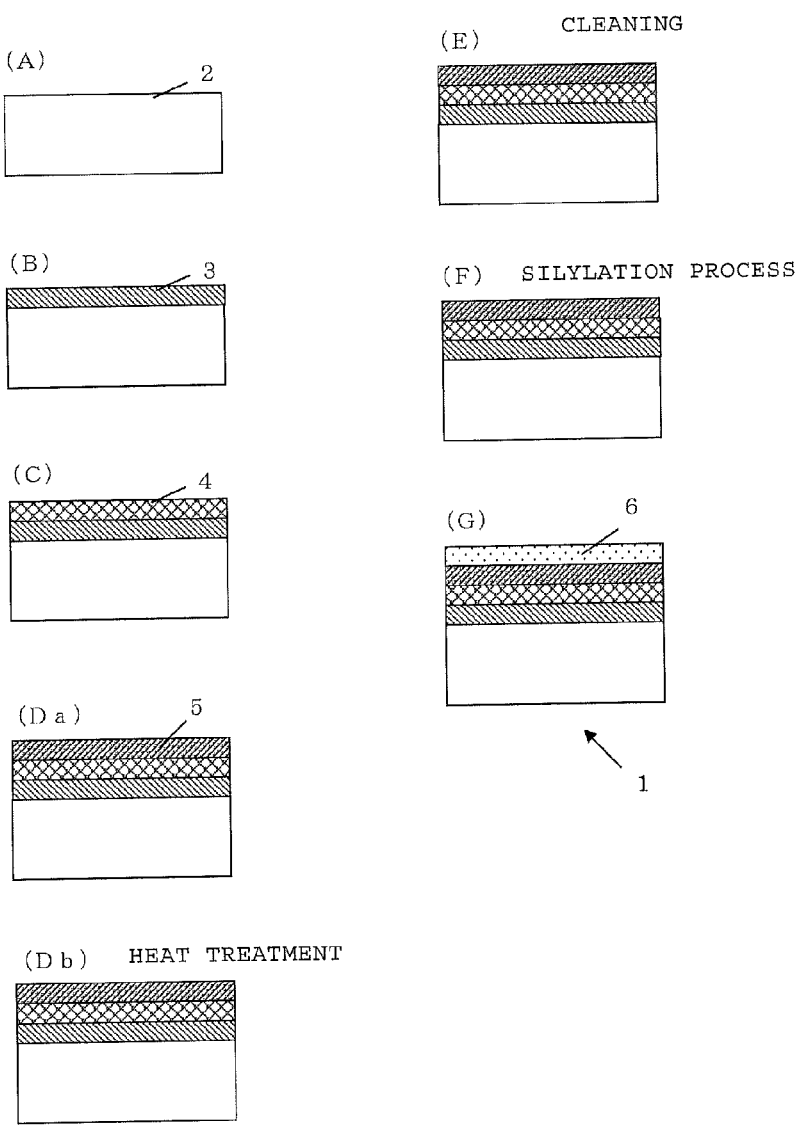
FIG. 2 is a flowchart of an example of the inventive method for manufacturing a photomask blank.

Next, the inventive method for manufacturing a photomask blank that can manufacture the photomask blank 1 as shown in FIG. 1 will be described. FIG. 2 is a flowchart of an example of the inventive manufacturing method.

A transparent substrate 2 is first prepared (FIG. 2 at (A)). The above transparent substrate, for example a quartz substrate, may be prepared as the transparent substrate 2.

Next, a phase shift film 3 (FIG. 2 at (B)) containing silicon, i.e., the above material, and a light-shielding film 4 (FIG. 2 at (C)) as a chromium-containing inorganic film are formed in this order. The method of forming these films may be, but not limited to, sputtering. The phase shift film enables higher resolution.

Forming the phase shift film 3 and the light-shielding film 4 formed thereon, or forming the light-shielding film 4 and the silicon-containing inorganic film 5 formed thereon with the above-described materials each having different etching resistance makes the etching process easier in production of photomasks.

Next, a silicon-containing inorganic film 5 composed of the above-described material is formed (FIG. 2 at (Da)).

The method of forming the silicon-containing inorganic film 5 may be chemical vapor deposition (CVD) with a gas containing silicon, such as, for example, monosilane, dichlorosilane, or trichlorosilane; forming the film by sputtering using at least one target containing silicon is preferable because this sputtering is easier and has good controllability.

The method of forming the film by sputtering may be, but not particularly limited to, DC sputtering, RF sputtering, or the like. In formation of the silicon-containing inorganic film 5, when the inorganic film to be formed contains silicon and oxygen, for example, reactive sputtering may be performed with silicon as a target and a gas of argon and oxygen as a sputtering gas. When the inorganic film to be formed contains nitrogen instead of oxygen, a nitrogen gas may be used instead of the oxygen gas. When the inorganic film to be formed contains both nitrogen and oxygen, a nitrogen gas and an oxygen gas may be used at the same time, or a nitrogen oxide gas such as nitrogen monoxide or nitrogen dioxide may be used. When the inorganic film to be formed further contains carbon, a gas containing carbon such as a methane gas, a carbon monoxide gas, or a carbon dioxide gas may be used. When the inorganic film to be formed further contains transition metal, a target including transition metal and silicon may be used, or cosputtering with both a silicon target and a transition metal target may be performed.

In addition, the silicon-containing inorganic film formed as above preferably has the Si—Si bonds because the Si—O bonds on the surface of this film can be controlled by a heat treatment under an oxygen-containing gas.

Next, a heat treatment is performed (FIG. 2 at (Db)).

This heat treatment is performed at a temperature more than 200° C. under an atmosphere containing oxygen. The concentration of oxygen contained in the atmosphere in the heat treatment is not particularly limited, and may be, for example, 1 to 100%. The heat treatment may be, but not limited to, infrared heating, resistance heating, or the like.

The temperature of the heat treatment need only be more than 200° C., and is preferably more than 300° C., more preferably more than 400° C., further preferably 450° C. or more; the temperature can be determined properly according to cost, the target number of defects after development, and the like.

After the above heat treatment, a silylation process, which is described later, is performed, and a resist film is then formed by application. This procedure enables generation of resist residues to be inhibited when a pattern is drawn on the resist film 6 and developed, as compared with conventional products, thereby significantly reducing the number of defects. Moreover, it is only necessary to perform the above heat treatment before the silylation process; the method is thus simple and easy.

Cleaning is then performed to remove particles present on the surface of a photomask blank (FIG. 2 at (E)). This cleaning may be performed by using ultrapure water, or functional water, such as ultrapure water containing ozone, hydrogen, or the like, and applying ultrasonic waves. Alternatively, cleaning with ultrapure water including surfactant is followed by rinsing with ultrapure water, and the above functional water cleaning, ultraviolet light irradiation, or the combination thereof is performed.

The silylation process is then performed to reduce surface energy of a photomask blank surface such that the photomask blank surface is alkylsilylated (FIG. 2 at (F)). Such a silylation process allows a fine resist pattern to be prevented from being separated and fallen.

The above HMDS is given as an example of a silylation agent, but does not limit the silylation agent.

Known silylation processes include a method of directly applying the silylation agent to the silicon-containing inorganic film of the substrate and a method of exposing the substrate to the silylation agent. Known exposing methods include a method of evaporating the silylation agent in a container holding the substrate and a method of vaporizing the silylation agent by bubbling of a nitrogen gas. The temperature at which the silylation agent is reacted may be, for example, in the range from 40° C. to 200° C. The process time, for example, is preferably adjusted such that the wettability of the substrate becomes a proper value by previously measuring a contact angle of water under the same conditions as the silylation processes.

The above-described resist film 6 is then formed on the silicon-containing inorganic film 5 by application after the silylation process, whereby a photomask blank 1 can be obtained (FIG. 2 at (G)).

The applying method is not particularly limited and may be performed, for example, in the same manner as a conventional method. The thickness of the resist film may be appropriately determined to obtain a good pattern form.

EXAMPLE

The present invention will be specifically described below through examples and comparative example, but the present invention is not limited these examples.

Example 1

A photomask blank was manufactured by the inventive manufacturing method.

A phase shift film of MoSiON with a thickness of 75 nm was formed on 152 mm squares of a quartz substrate having a thickness of about 6 mm by sputtering. A gas of oxygen, nitrogen, and argon was used as a sputtering gas; $MoSi_2$ and Si were used as two types of target. The substrate was rotated at 30 rpm to form the film.

The composition of the phase shift film was Mo:Si:O:N=1: 4:1:4 (atomic ratio), which was investigated by an electron spectroscopy for chemical analysis (ESCA) method (also referred to as an XPS method) with K-Alpha (manufactured by Thermo Fisher Scientific K.K.).

On the phase shift film, a CrN layer (30 nm) and a CrON layer (20 nm) as light-shielding films were formed in order from a substrate side upward by sputtering. A gas of argon and nitrogen was used as a sputtering gas for the CrN layer; a gas of oxygen, nitrogen, and argon was used as a sputtering gas for the CrON layer; a chrome metal was used as a target. The substrate was rotated at 30 rpm to form the film.

The compositions of the light-shielding films were Cr:N=9:1 (atomic ratio) for the CrN layer and Cr:O:N=4:5:1 (atomic ratio) for the CrON layer, which were investigated by the ESCA.

On the top of the light-shielding films, an SiO film with a thickness of 5 nm as an etching mask film (a hard mask) containing silicon was formed by sputtering. A gas of oxygen and argon was used as a sputtering gas; Si was used as a target. The substrate was rotated at 30 rpm to form the film.

The investigation of the SiO by the ESCA revealed that the Si—Si bonds were seen.

The resultant was heated at 500° C. under an atmosphere of 20% of oxygen and 80% of nitrogen, and the silylation process was then performed with HMDS. After that, a negative type of electron beam resist (manufactured by Shin-Etsu Chemical Co., Ltd.,) was applied and developed with tetramethylammonium hydroxide. The resultant was rinsed with pure water.

Figure 3:
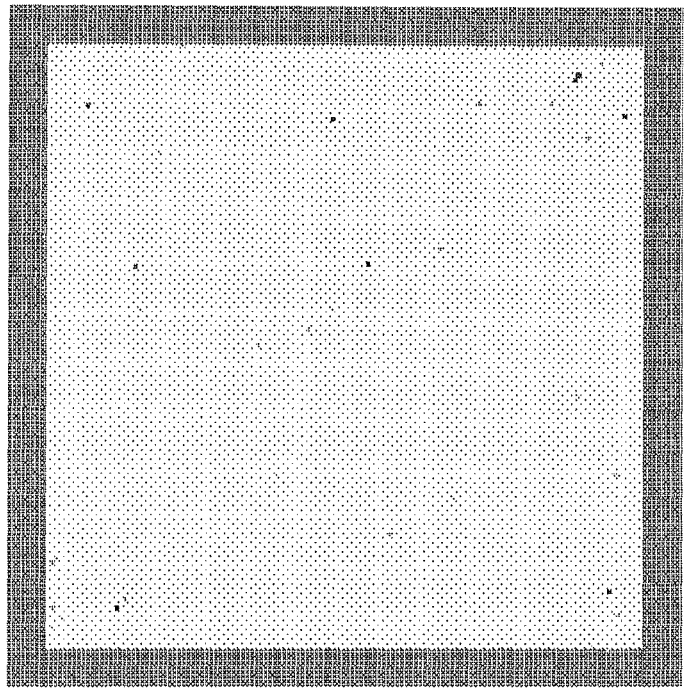
FIG. 3 is an observation view showing defects distribution after development in Example 1.

The investigation of the resultant with a defect inspection apparatus MAGICS 2350 (manufactured by Lasertec Corporation) demonstrated a good result in which, as shown in FIG. 3, the number of defects was extremely small. The number of detected defects having a size of 0.1 μm or more was 42.

Example 2

A photomask blank was obtained as in Example 1 except that the temperature of the heat treatment was changed into 300° C.

The number of defects after development was consequently 1180.

Comparative Example 1

A photomask blank was manufactured as in Example 1 except that the heat treatment was not performed.

Figure 4:
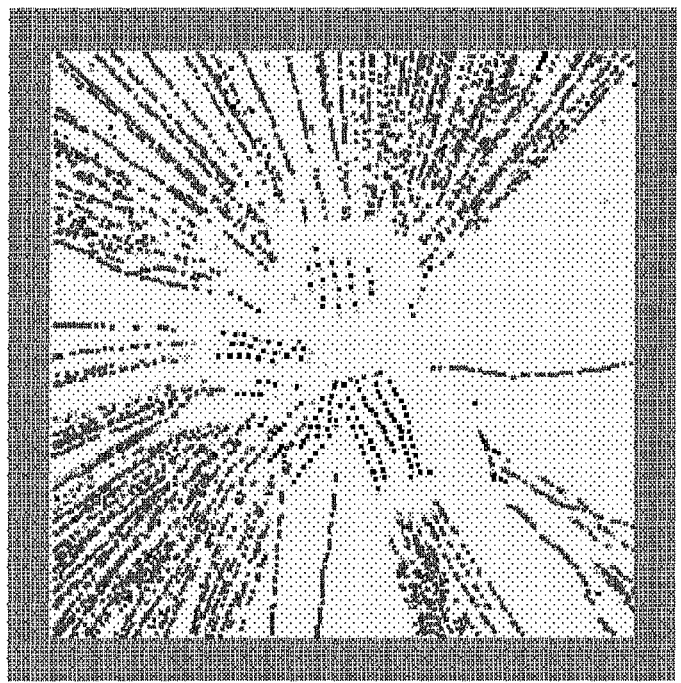
FIG. 4 is an observation view showing defects distribution after development in Comparative Example 1.

The investigation of defects after development revealed that, as shown in FIG. 4, many resist residues remained.

The number of detected defects having a size of 0.1 µm or more was 4704, which was very large.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for manufacturing a photomask blank having at least a silicon-containing inorganic film over a transparent substrate and a resist film on the inorganic film, comprising:
    forming the silicon-containing inorganic film;
    heat treating the formed silicon-containing inorganic film at a temperature more than 200° C. under an atmosphere containing oxygen;
    performing a silylation process after the heat treatment; and then
    forming the resist film by application.

2. The method for manufacturing a photomask blank according to claim 1, wherein the heat treatment is performed at a temperature more than 400° C.

3. The method for manufacturing a photomask blank according to claim 1, wherein the silicon-containing inorganic film further contains oxygen.

4. The method for manufacturing a photomask blank according to claim 2, wherein the silicon-containing inorganic film further contains oxygen.

5. The method for manufacturing a photomask blank according to claim 3, wherein the silicon-containing inorganic film is composed of silicon and oxygen.

6. The method for manufacturing a photomask blank according to claim 4, wherein the silicon-containing inorganic film is composed of silicon and oxygen.

7. The method for manufacturing a photomask blank according to claim 1, wherein a chromium-containing inorganic film is formed before forming the silicon-containing inorganic film.

8. The method for manufacturing a photomask blank according to claim 2, wherein a chromium-containing inorganic film is formed before forming the silicon-containing inorganic film.

9. The method for manufacturing a photomask blank according to claim 3, wherein a chromium-containing inorganic film is formed before forming the silicon-containing inorganic film.

10. The method for manufacturing a photomask blank according to claim 4, wherein a chromium-containing inorganic film is formed before forming the silicon-containing inorganic film.

11. The method for manufacturing a photomask blank according to claim 5, wherein a chromium-containing inorganic film is formed before forming the silicon-containing inorganic film.

12. The method for manufacturing a photomask blank according to claim 6, wherein a chromium-containing inorganic film is formed before forming the silicon-containing inorganic film.

13. The method for manufacturing a photomask blank according to claim 7, wherein a silicon-containing phase shift film is formed on the transparent substrate before forming the chromium-containing inorganic film.

14. The method for manufacturing a photomask blank according to claim 8, wherein a silicon-containing phase shift film is formed on the transparent substrate before forming the chromium-containing inorganic film.

15. The method for manufacturing a photomask blank according to claim 9, wherein a silicon-containing phase shift film is formed on the transparent substrate before forming the chromium-containing inorganic film.

16. The method for manufacturing a photomask blank according to claim 10, wherein a silicon-containing phase shift film is formed on the transparent substrate before forming the chromium-containing inorganic film.

17. The method for manufacturing a photomask blank according to claim 11, wherein a silicon-containing phase shift film is formed on the transparent substrate before forming the chromium-containing inorganic film.

18. The method for manufacturing a photomask blank according to claim 12, wherein a silicon-containing phase shift film is formed on the transparent substrate before forming the chromium-containing inorganic film.

19. The method for manufacturing a photomask blank according to claim 1, wherein the silicon-containing inorganic film is a hard mask.

20. The method for manufacturing a photomask blank according to claim 18, wherein the silicon-containing inorganic film is a hard mask.

21. The method for manufacturing a photomask blank according to claim 1, wherein hexamethyldisilazane is used for the silylation process.

22. The method for manufacturing a photomask blank according to claim 20, wherein hexamethyldisilazane is used for the silylation process.

* * * * *